(12) United States Patent
Van Asten et al.

(10) Patent No.: US 7,411,667 B2
(45) Date of Patent: Aug. 12, 2008

(54) METHOD FOR CORRECTING DISTURBANCES IN A LEVEL SENSOR LIGHT PATH

(75) Inventors: Nicolaas Antonius Allegondus Johannes Van Asten, Breda (NL); Oana Cristina Balan, Eindhoven (NL); Luberthus Ouwehand, 's-Hertogenbosch (NL); Machiel Jacobus Johannes Viguurs, Rosmalen (NL); Alexander Charles Franciscus Anna Van Well, Best (NL); Lun Kai Cheng, Krimpen aan den Ijssel (NL); Huibert Blokland, Noordeloos (NL); Elke Van Loenhout, Asten (NL); Hans Baltus Bakker, Utrecht (NL)

(73) Assignee: ASML Netherlands B.V., Veldhoven (NL)

( * ) Notice: Subject to any disclaimer, the term of this patent is extended or adjusted under 35 U.S.C. 154(b) by 392 days.

(21) Appl. No.: 11/252,254

(22) Filed: Oct. 18, 2005

(65) Prior Publication Data

US 2006/0274324 A1 Dec. 7, 2006

Related U.S. Application Data

(60) Provisional application No. 60/686,965, filed on Jun. 3, 2005.

(51) Int. Cl.
*G01B 11/26* (2006.01)
*G01B 11/02* (2006.01)
*G01C 1/00* (2006.01)

(52) U.S. Cl. .................... 356/139.1; 356/516
(58) Field of Classification Search .............. 356/139.1, 356/496, 510, 516
See application file for complete search history.

(56) References Cited

U.S. PATENT DOCUMENTS

| 6,501,553 | B1 | 12/2002 | Ogawa et al. |
| 6,507,405 | B1 | 1/2003 | Grek et al. |
| 6,806,966 | B1 * | 10/2004 | Mueller et al. .............. 356/514 |
| 2004/0000627 | A1 * | 1/2004 | Schuster .................. 250/201.2 |
| 2004/0080737 | A1 * | 4/2004 | Jasper et al. .................. 355/55 |

(Continued)

FOREIGN PATENT DOCUMENTS

EP 0 502 583 B1 6/1998

(Continued)

*Primary Examiner*—Patrick Connolly
(74) *Attorney, Agent, or Firm*—Pillsbury Winthrop Shaw Pittman LLP

(57) ABSTRACT

The invention relates to a level sensor for determining a height of a substrate. The level sensor generates one or more measurement beam and directs the measurement beam to a measurement spot on the substrate and produces a reflected measurement beam. The level sensor also generates one or more reference beams. A detector detects both the reflected measurement beam and the reference beam, respectively, and produces a measurement signal and a reference signal, respectively, the measurement signal being indicative for the height at the measurement spot. A processor that receives these signals and corrects the measurement signal based on the reference signal. The level sensor has an optical arrangement in a predetermined area close to where the substrate is to be located. The measurement beam and the reference beam propagate along substantially equal optical paths of propagation in the predetermined area. The optical arrangement deviates the reference beam from the substantially equal optical paths of propagation in the predetermined area such that the at least one reference beam does not hit the substrate.

17 Claims, 5 Drawing Sheets

U.S. PATENT DOCUMENTS

| | | |
|---|---|---|
| 2005/0037288 A1 | 2/2005 | Chen |
| 2005/0046885 A1 | 3/2005 | Morikawa |
| 2005/0057757 A1* | 3/2005 | Colonna De Lega et al. ............ 356/497 |
| 2005/0068540 A1* | 3/2005 | De Groot et al. ............ 356/512 |
| 2005/0078320 A1* | 4/2005 | Mueller et al. ............ 356/512 |
| 2005/0179909 A1* | 8/2005 | Krijnen ............ 356/500 |
| 2007/0013915 A1* | 1/2007 | Van Asten et al. ............ 356/498 |

FOREIGN PATENT DOCUMENTS

JP 2000-81320 A 3/2000

* cited by examiner

METHOD FOR CORRECTING DISTURBANCES IN A LEVEL SENSOR LIGHT PATH

RELATED APPLICATIONS

This Application claims priority to U.S. Provisional Application No. 60/686,965, filed Jun. 3, 2005, the entire contents of which is hereby incorporated by reference.

FIELD OF THE INVENTION

The present invention relates to lithographic apparatus and more specific to level sensors.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

In lithography, a Level Sensor (LS) is used for measuring the substrate height. The substrate height is measured at multiple positions on the substrate, this is done using multiple LS spots (or "measurement spots") in parallel. Noise and drift in the Level Sensor will deteriorate the accuracy and reproducibility of the measured positions. This noise and drift can be caused by movements of mechanical and optical parts of the LS system, drift and noise of electrical parts of the LS system and changes in the (optical) refractive-index of the media (e.g. air, glass) through which light beams of the LS system pass. All the LS spots can be influenced by these effects, also spots which measure on a reference surface. To separate the noise and drift from the signal introduced by a height change of the substrate, noise and drift are measured independently from the height measurement, using a reference beam as for example described in EP 0 502 583 A1. The signal from the reference beam is subtracted from the measurement spots which measure on the substrate, to correct for the disturbance. This will give a noise-free and drift-free position measurement.

However, there may be a disturbance in the reference beam that is not the same as the disturbance in the measurement beam(s). Reasons for a difference in disturbance of the reference beam with reference to the disturbance of a measurement beam may be:

Time delay of disturbance; the disturbance is not seen at the same time for all LS spots (phase difference between LS spots);

Location of disturbance; very local disturbances in air at the focus point of the LS spots may only be seen by few LS spots;

Movement or deformation of mechanical components in LS will have a different effect on the different LS spots.

SUMMARY

It is desirable to improve the known correction methods for a level sensor.

According to an aspect of the invention, there is provided a level sensor for determining a height of a substrate, the level sensor being arranged to generate at least one measurement beam and direct the at least one measurement beam to a measurement spot on the substrate in order to produce at least one reflected measurement beam;

generate at least one reference beam;

detect both the at least one reflected measurement beam and the at least one reference beam, respectively, and produce at least one measurement signal and at least one reference signal, respectively, the measurement signal being indicative for the height at the measurement spot;

correct the measurement signal based on the reference signal wherein the level sensor comprises an optical arrangement arranged in a predetermined area close to where the substrate is to be located, and the level sensor is arranged to propagate the at least one measurement beam and the at least one reference beam along substantially equal but different optical paths of propagation in the predetermined area, the optical arrangement being arranged to deviate the at least one reference beam from the substantially equal optical paths of propagation in the predetermined area such that the at least one reference beam does not hit the substrate.

According to another aspect of the invention, there is provided an imaging apparatus with such a level sensor.

According to another aspect of the invention, there is provided a lithographic projection apparatus with such an imaging apparatus.

According to another aspect of the invention, there is provided a method of determining a height of a substrate comprising:

generating at least one measurement beam and directing the at least one measurement beam to a measurement spot on the substrate in order to produce at least one reflected measurement beam;

generating at least one reference beam;

detecting both the at least one reflected measurement beam and the at least one reference beam, respectively, and producing at least one measurement signal and at least one reference signal, respectively, the measurement signal being indicative for the height at the measurement spot;

correcting the measurement signal based on the reference signal;

arranging an optical arrangement in a predetermined area close to where the substrate is to be located, and propagating the at least one measurement beam and the at least one reference beam along substantially equal optical paths of propagation apart from in the predetermined area, deviating the at least one reference beam from the substantially equal optical paths of propagation in the predetermined area by the optical arrangement such that the at least one reference beam does not hit the substrate.

Finally, the invention is directed to a level sensor for determining a height of a substrate, the level sensor comprising:

at least one source of radiation to generate at least one reference beam and to generate at least one measurement beam and direct the at least one measurement beam to a measurement spot on the substrate in order to produce at least one reflected measurement beam;

at least one detector to detect both the at least one reflected measurement beam and the at least one reference beam, respectively, and produce at least one measurement signal and at least one reference signal, respectively, the measurement signal being indicative for the height at the measurement spot; and a processor to receive the at least one measurement signal and the at least one reference signal, and to correct the measurement signal based on the reference signal;

wherein the level sensor comprises an optical arrangement arranged in a predetermined area close to where the substrate is to be located, and the level sensor is arranged to propagate the at least one measurement beam and the at least one reference beam along substantially equal but different optical paths of propagation in the predetermined area, the optical arrangement being arranged to deviate the at least one reference beam from the substantially equal optical paths of propagation in the predetermined area such that the at least one reference beam does not hit the substrate.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
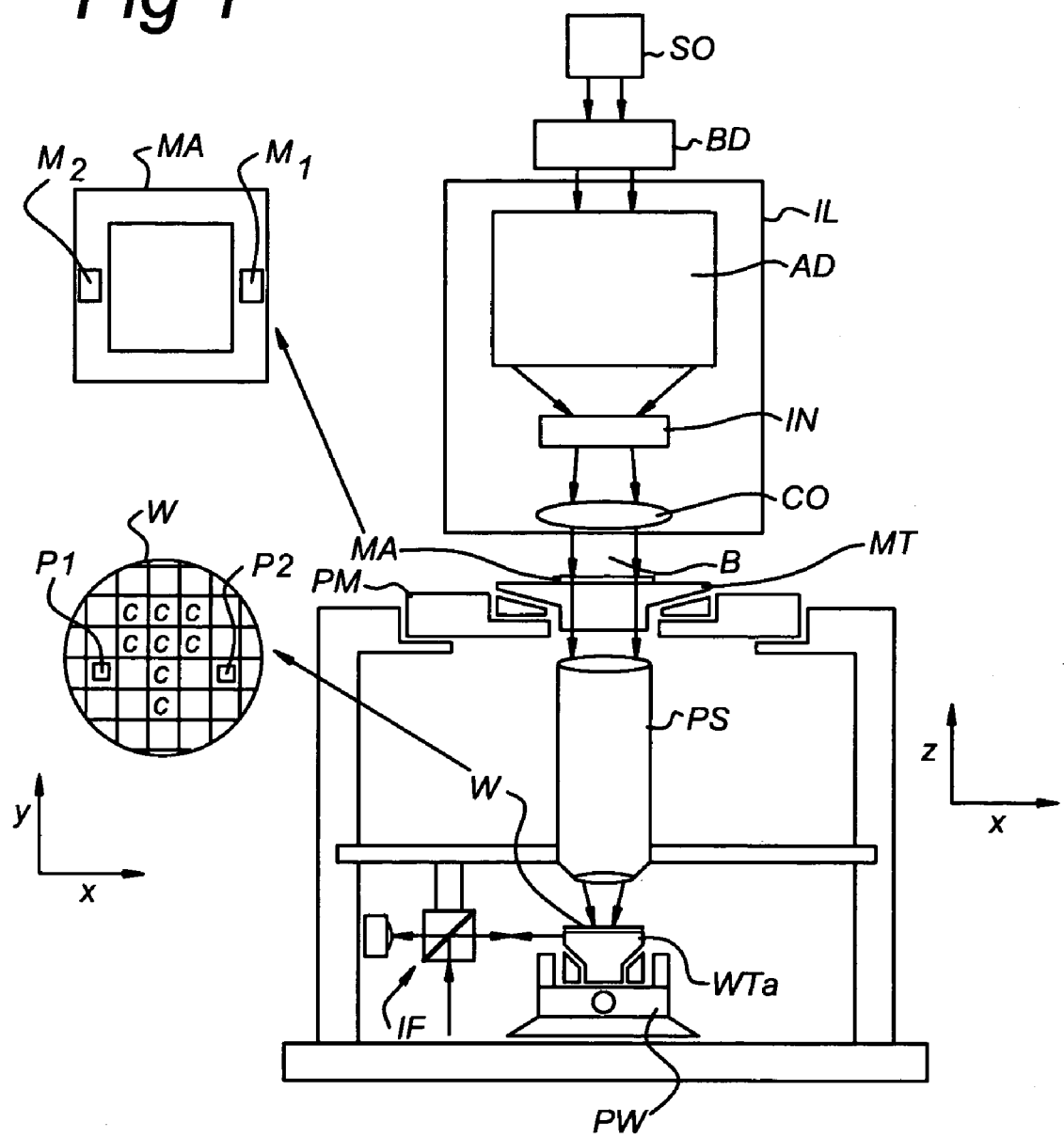
FIG. 1 depicts a lithographic apparatus according to an embodiment of the invention.

FIG. 1 schematically depicts a lithographic apparatus according to one embodiment of the invention. The apparatus comprises:

an illumination system (illuminator) IL configured to condition a radiation beam B (e.g. UV radiation or EUV radiation);

a support structure (e.g. a mask table) MT constructed to support a patterning device (e.g. a mask) MA and connected to a first positioner PM configured to accurately position the patterning device in accordance with certain parameters;

a substrate table (e.g. a substrate table) WTa constructed to hold a substrate (e.g. a resist-coated substrate) W and connected to a second positioner PW configured to accurately position the substrate in accordance with certain parameters; and a projection system (e.g. a refractive projection lens system) PS configured to project a pattern imparted to the radiation beam B by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure supports, i.e. bears the weight of, the patterning device. It holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source may be an integral part of the lithographic apparatus, for example when the source is a mercury lamp. The source SO and the illuminator IL, together with the beam delivery system BD if used, may be referred to as a radiation system.

The illuminator IL may comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator IN and a condenser CO. The illuminator may be used to condition the radiation beam, to have a desired uniformity and intensity distribution in its cross-section.

The radiation beam B is incident on the patterning device (e.g., mask MA), which is held on the support structure (e.g., mask table MT), and is patterned by the patterning device. Having traversed the mask MA, the radiation beam B passes through the projection system PS, which focuses the beam onto a target portion C of the substrate W. With the aid of the second positioner PW and position sensor IF (e.g. an interferometric device, linear encoder or capacitive sensor), the substrate table WTa can be moved accurately, e.g. so as to position different target portions C in the path of the radiation beam B. Similarly, the first positioner PM and another position sensor (which is not explicitly depicted in FIG. 1) can be used to accurately position the mask MA with respect to the path of the radiation beam B, e.g. after mechanical retrieval from a mask library, or during a scan. In general, movement of the mask table MT may be realized with the aid of a long-stroke module (coarse positioning) and a short-stroke module (fine positioning), which form part of the first positioner PM. Similarly, movement of the substrate table WTa may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus could be used in at least one of the following modes:

1. In step mode, the mask table MT and the substrate table WTa are kept essentially stationary, while an entire pattern imparted to the radiation beam is projected onto a target portion C at one time (i.e. a single static exposure). The substrate table WTa is then shifted in the X and/or Y direction so that a different target portion C can be exposed. In step mode, the maximum size of the exposure field limits the size of the target portion C imaged in a single static exposure.

2. In scan mode, the mask table MT and the substrate table WTa are scanned synchronously while a pattern imparted to the radiation beam is projected onto a target portion C (i.e. a single dynamic exposure). The velocity and direction of the substrate table WTa relative to the mask table MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT is kept essentially stationary holding a programmable patterning device, and the substrate table WTa is moved or scanned while a pattern imparted to the radiation beam is projected onto a target portion C. In this mode, generally a pulsed radiation source is employed and the programmable patterning device is updated as required after each movement of the substrate table WTa or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
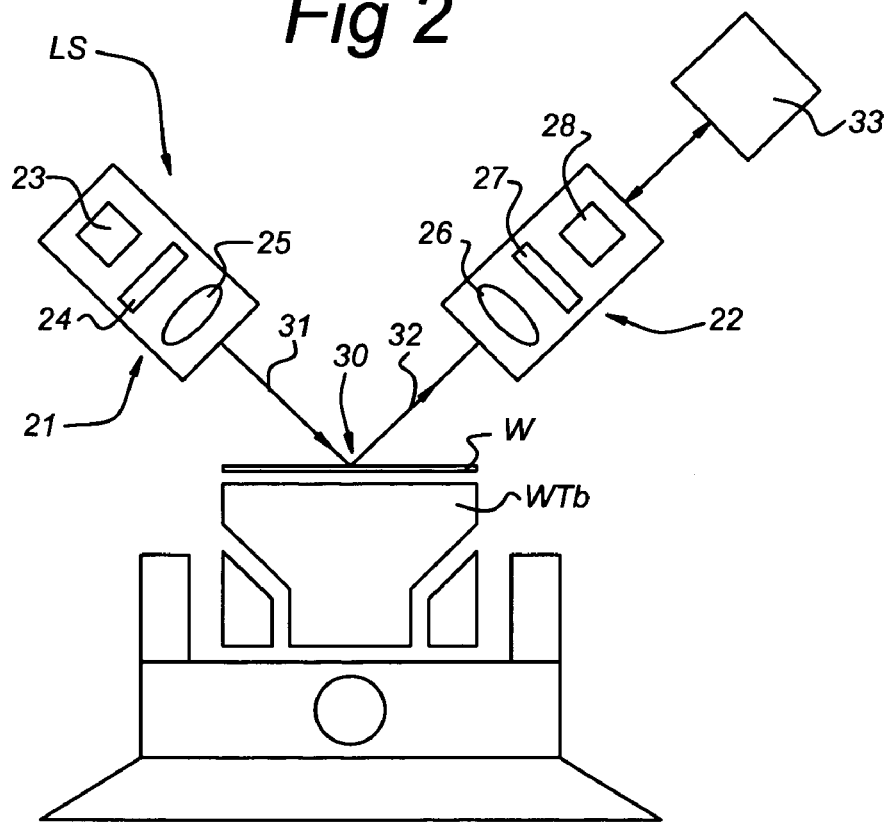
FIG. 2 shows a level sensor system according to an embodiment.

FIG. 2 shows part of an embodiment according to the invention. In FIG. 2, a measurement station of a dual stage lithographic apparatus is shown. The measurement station comprises a substrate table WTb on which a substrate W is positioned. Above the substrate table WTb, a level sensor (LS) system is arranged comprising a projection system 21 and a detection system 22. The projection system 21 comprises a radiation source 23, a projection grating 24 and an optical element 25. The detection system 22 comprises an optical element 26, a detection grating 27 and a detector 28. The projection system 21 is arranged to project multiple measurement beams 31 onto the substrate W rendering spots 30. These so-called LS spots 30 are detected by the detection system 22. The LS spots 30 may be projected in parallel to one another in a direction perpendicular to FIG. 2. The detection system 22 is arranged to send measurement signals to a processor 33.

Figure 3:
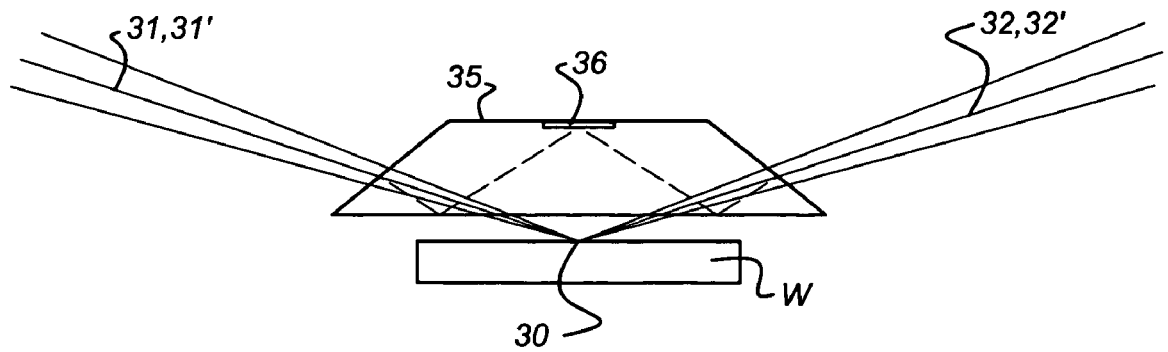
FIG. 3 shows an optical arrangement for deviating the measurement beam, according to an embodiment.

According to an aspect of the invention, some measurement beams are used as reference beams 31 and to that effect are deviated just upstream from the associated measurement position on the substrate W. In a height measurement based on the triangulation method, this can be done with a prism or a set of mirrors which deviates part of the beams as produced by radiation source 23. FIG. 3 shows a side view of a prism 35 positioned just above one particular LS spot 30. Because of the configuration of the prism 35, the reference beam 31 is deviated and is not projected onto the substrate W. Instead it is projected onto the top surface of the prism 35 rendering a reference spot 36. The reference beam 31 is reflected three times internally within the prism 35, as shown, and produces a reflected reference beam 32 which comprises an image of spot 36. This image of the reference spot 36 is detected by a reference detector 28r in detection system 22, that produces a reference signal that is sent to processor 33 for further evaluation. In FIG. 3 the deviated optical beam inside the prism 35 is indicated by a dotted line.

A measurement beam 31' is projected onto a LS spot 30 next to the reference spot 36 that is covered by the prism 35. The measurement beam 31' is depicted by a straight line in FIG. 3, being reflected by the substrate W. The measurement beam 31' is reflected by substrate W to produce reflected measurement beam 32' comprising an image of spot 30. This image of spot 30 is detected by detector 28 that produces a measurement signal for processor 33.

Figure 4:
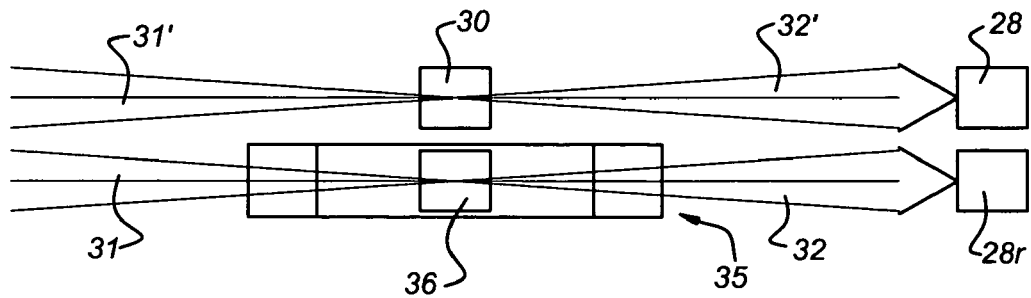
FIG. 4 shows a top view of FIG. 3.

To better explain this embodiment, a top view of the two LS spots is shown in FIG. 4. FIG. 4 shows the two beams 31, 31'. Reference beam 31 is directed through the prism 35 and finally detected by reference detector 28r. FIG. 4 shows clearly the proximity of the prism 35 and the LS spot 30. The measurement beam 31 is reflected by the substrate W and detected by the detector 28, referred to as measurement detector.

Figure 6:
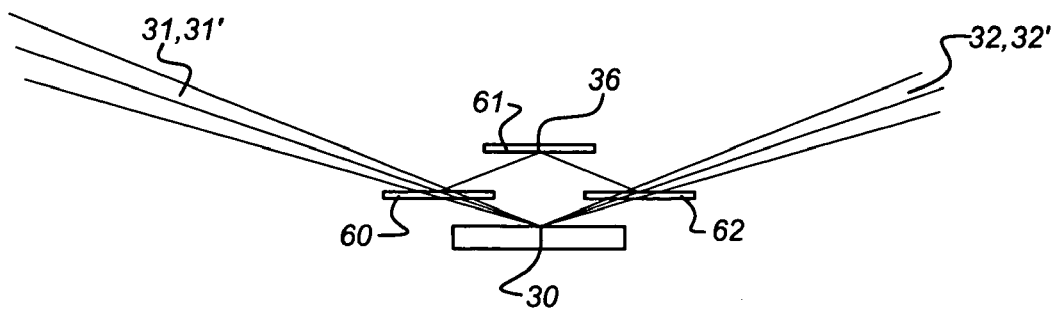
FIG. 6 shows an optical arrangement for deviating the measurement beam, according to another embodiment.
Figure 7:
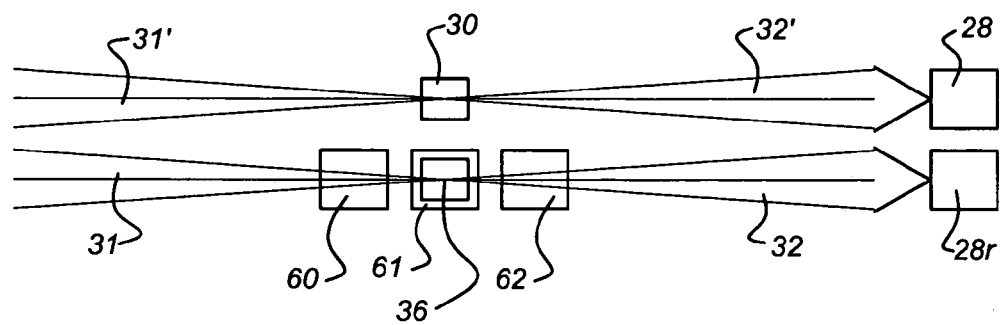
FIG. 7 shows a top view of FIG. 6.

Instead of using a prism, mirrors can be used as is shown in FIG. 6 showing a side view and FIG. 7 showing a top view of an alternative embodiment. In this embodiment, three mirrors 60, 61, 62 are positioned just above one LS spot 30, so as to deviate the reference beam 31 and project it to reference spot 36, i.e. on the mirror 61. Mirror 61 reflects reference beam 31 and directs it to mirror 62, which reflects it again to produce reflected reference beam 32. In the set-up of FIGS. 6 and 7, the measurement beam 31' is not deviated but only reflected by substrate W, as in the set-up of FIGS. 3, 4.

In the prism configuration of FIGS. 3, 4, the deviated optical path is very stable, noise-free and drift-free, because there will be no air-flow in the glass and the mechanical construction is very stable. The prism configuration can be modified to compensate the extra path length in the prism 35 and to reduce the dispersion effect caused by refraction, see FIG. 5.

Figure 5:
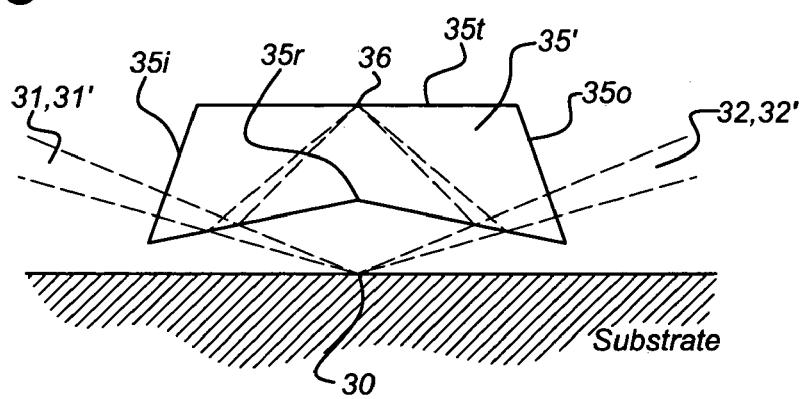
FIG. 5 shows a special embodiment of the arrangement of FIG. 3.

In the embodiment of FIG. 5, an alternative prism 35' is shown having an input surface 35i, an output surface 35o, a top surface 35t and a reflective surface 35r. The input surface 35i is arranged substantially perpendicular to reference beam 31 whereas output surface 35o is arranged substantially perpendicular to reflected reference beam 32. The reflective surface 35r is not flat but has two sub-surfaces connected to one another under a predetermined angle. The reflective surface receives reference beam 31 after transmission through input surface 35i, reflects reference beam 31 to form reference spot 36 on the top surface 35t of the prism 35'. The top surface 35t reflects reference beam 31 towards reflective surface 35r again which reflects the received beam to form reflected reference beam 32. The advantage of prism 35' in FIG. 5 compared to the prism 35 in FIG. 3 is that the prism 35' does not show dispersion because the glass-air interfaces at surfaces 35i and 35o are substantially perpendicular to the beams 31, 31', 32, 32'.

Figure 8:
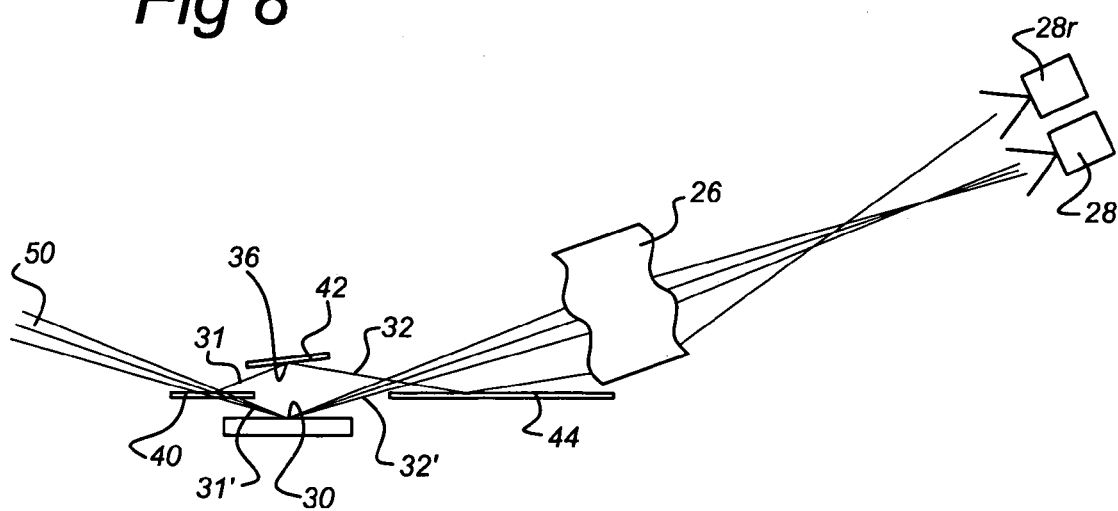
FIG. 8 shows an arrangement according to yet another embodiment.

In another embodiment, an original beam 50 is split into measurement beam 31' and reference beam 31 using for example a semi-transparent mirror, see FIG. 8. FIG. 8 shows a semi-transparent mirror 40 reflecting a portion, e.g., 50%, of original beam 50 to form reference beam 31 and transmitting the remaining portion of the original beam 50 to form measurement beam 31'. The reference beam 31 is imaged as reference spot 36 on a mirror 42 that may have a tilted orientation towards wafer W. The mirror 42 reflects the reference beam 31 to mirror 44 that produces reflected reference beam 32 that is directed via optical element 26 towards reference detector 28r. Both the reflected reference beam 32 and the reflected measurement beam 32' are passing through this same optical element 26. The embodiment of FIG. 8 can be extended for a plurality of original beams, i.e., for an embodiment with a plurality of semi-transparent mirrors, a plurality of reference beams and associated measurement beams.

Figure 9:
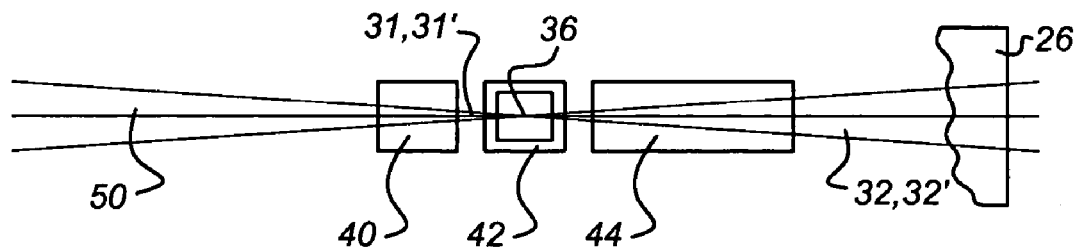
FIG. 9 shows a top view of FIG. 8.

FIG. 9 shows a top view of the embodiment of FIG. 8. Note that measurement spot 30 is covered by mirror 42 in this view. The design in FIGS. 8, 9 can be made for several spots, where every measurement spot 30 is associated with its own reference spot 36.

In an aspect of the invention, a dual stage lithographic apparatus is provided comprising a level sensor LS as described above. After measuring the height on all measurement positions on the substrate W at the measurement stage, a 'wafer map' is determined. Next, the shape of the disturbance measured with the reference beam(s) 31 (i.e. length, amplitude, frequency, correlation, difference) can be used to produce a corrected wafer map using one or more of the correction methods described below.

The principle of the correction methods is based on the following. It is assumed that the total noise and drift measured by the reference beam(s) 31 is identical to the noise and drift of the measurement beam(s) 31', but the reference beam 31 does not contain height information about the measured position. The signal of the reference beam(s) 31 can then be used by processor 33 for correcting measurement results of one or more of the measurement beams.

The reproducibility and accuracy of the position measurement is increased by reducing noise and drift caused by movement of mechanical and optical parts of the system, drift and noise of electrical parts of the system and changes in the (optical) refractive-index of the media (e.g. air, glass) through which beams 31, 31' pass. Furthermore, synchronous detection increases the correlation between noise and drift in the reference beam 31 with the noise and drift in the measurement beam 31', which contains the position information. Therefore the noise in the measurement signal may be removed by processor 33 after correction with the reference signal. Because the optical path of the reference beam 31 and the measurement beam 31' are essentially the same (preferable but not required), the noise and drift in the reference signal have a high correlation with respect to the noise and drift in the measurement signal which contains the position (i.e. height) information. Therefore, the noise in the position measurement signal(s) may be removed by processor 33 after correction with the reference signal from the reference beam(s). When the reference detector 28r for detecting the reference beam(s) and measurement detector 28 for detecting the measurement beam 31' is the same, the noise and drift introduced during detection of the reference signal and the measurement signal are the same. Therefore the noise in the measurement signal may be removed by processor 33 after correction with the reference signal.

Due to the fact that the additional optical arrangement, e.g. the prism 35, 35' and mirrors 60, 61, 62, 40, 42, 44 is positioned just before the measurement spot, the only place where the reference beam 31 propagates along a different path than the actual measurement beam 31' is near the spot 30 on the measurement sample (e.g. substrate W). However, this part of the optical system is less sensitive for air flows or temperature gradients than the rest of the system. The most sensitive part for changes in the (optical) refractive-index of the optical system is far from the focal point where the image is formed on the substrate W. At this position the reference beam 31 and the measurement beam 31' overlap and the disturbances caused in both beams at this position are exactly the same (high correlation). Therefore, the noise and drift caused in this part can be compensated for totally using the level LS sensor according to the invention.

Figure 10:
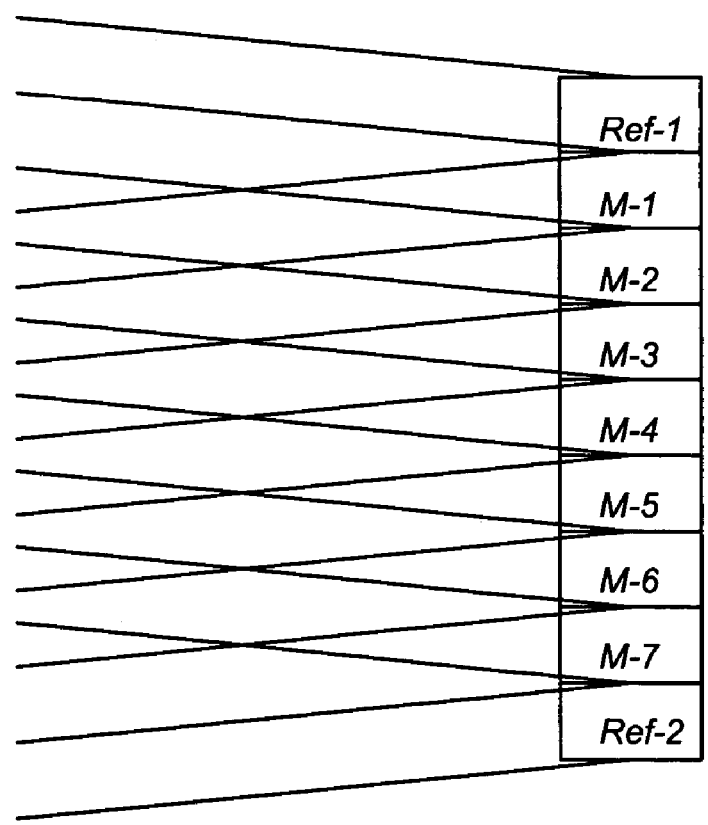
FIG. 10 shows an embodiment of the positioning of measurement spots with respect to reference spots.

FIG. 10 shows several measurement spots M-1 to M-7 and reference spots Ref-1 and Ref-2 in an embodiment of the invention. All of these spots M-1, M-7, Ref-1, Ref-2 may each be imaged on one detector or a plurality of detectors. FIG. 10 is a top view and it should be noted that the measurement spots M-1, M-7 are focussed on the substrate W but the reference spots Ref-1, Ref-2 are actually focussed onto, e.g., the top side of prism 35 or mirror 61, 42. The location of the measurement spots M-1, M-7 on the substrate W (in focus) in this embodiment is determined by the projection grating 24 and the detection grating 27. The apertures of both gratings 24, 27 and the layout of the mirrors 60, 61, 62, 42, 44 and prism 35 determine the positions of the reference spots Ref-1, Ref-2.

It should be noted that instead of using gratings, the invention also works with a configuration in which the measurement spots are produced using multiple radiation sources such as for example, laser sources, each source producing one measurement beam.

Out of focus the reference and measurement beams 31, 31' will overlap, because of the divergence (Numerical Aperture>0) of the beams. Overlapping beams will have the same disturbance and the detected signal will have high correlation. Detection signals of spots close to each other will have the highest correlation. The correlating part of detection signals of two spots which are not next to each other (e.g. Ref-1 and Ref-2, see FIG. 10), is the same in all intermediate spots (M-1-M-7) located between these two spots.

There may be several noise contributions/disturbances:
  Optical disturbance via contamination, temperature, refractive index changes in the optical path of the level sensor beams,
  LS signal noise from substrate height, measurement,
  Electronic noise from level sensor LS,
  Drift (electrical or mechanical) due to temperature changes,
  Mechanical resonance/vibrations of LS components.

According to embodiments of the invention, the processor 33 may use different correction methods to filter out disturbances in the measurement beams:
  The disturbance of measurement beams can be determined by using interpolation of reference signals associated with the reference beams at different locations around or between these measurement beams.
  If processor 33 measures a high correlation between time traces of different reference signals, a high correlation between the disturbance of the reference beam(s) and the measurement beam(s) may be expected. A correlation coefficient relating to this correlation can be used by processor 33 as a weighting factor for how much correction should be used.
  If processor 33 measures only a high correlation for a part of the frequency spectrum or even a certain frequency peak (e.g. resonance of the system) between the measurement signals and the reference signal(s), a correction for only this part of the spectrum may be made by processor 33.
  If processor 33 measures a delay between time traces of different reference signals, then there will also be a delay between the disturbance of the reference beam(s) and the different measurement beams. In this case, a delay correction method may be used by processor 33.
  If processor 33 measures only a phase shift (delay) for a part of the frequency spectrum or even a certain frequency peak (e.g. resonance of the system) between the measurement signals and the reference signal(s), a correction for only this part of the spectrum can be used by processor 33.

In an embodiment, per stroke, per die or per measurement point, any correction method can be switched on/off, based on the reference signals.

These correction methods may be used in an off-line measurement situation like in a dual-stage apparatus, because the shape of the measurement signal(s) and the reference signal(s) (i.e., their behavior as function of time) has to be known, as well as a possible correction before the correction can be applied during exposure. Such a correction may take the form of a corrected wafer map. Then, the substrate W may be exposed based on the corrected wafer map.

In an embodiment, two or more reference beams 31 at different locations around or between the measurement spots 30 are used, e.g. 2 reference beams 31 on left- and right-side of the measurement spots 30.

It is also possible to determine a relation between disturbances in the reference beams 31 and disturbances in the measurement beams 31' in advance, resulting in calibration data. The signal of the measurement beam(s) 31' may be processed by processor 33 using the reference signal(s) and these calibration data.

In an embodiment, disturbances in the measurement spots M-1-M-7 are determined using information from the reference spots Ref-1, Ref-2 and an interpolation algorithm. Now, an example of a simple practical implementation of such an interpolation is given, in which ZM-x(t) is a measurement signal produced by a measurement detector detecting measurement spot M-x, and wherein ZRef-y(t) is a reference signal produced by a reference detector detecting reference spot Ref-y.

$$ZM\text{-}1(t) := ZM\text{-}1(t) - 0.875 * Zref\text{-}1(t) - 0.125 * Zref\text{-}2(t)$$

$$ZM\text{-}2(t) := ZM\text{-}2(t) - 0.750 * Zref\text{-}1(t) - 0.250 * Zref\text{-}2(t)$$

$$ZM\text{-}3(t) := ZM\text{-}3(t) - 0.625 * Zref\text{-}1(t) - 0.375 * Zref\text{-}2(t)$$

$$ZM\text{-}4(t) := ZM\text{-}4(t) - 0.500 * Zref\text{-}1(t) - 0.500 * Zref\text{-}2(t)$$

$$ZM\text{-}5(t) := ZM\text{-}5(t) - 0.375 * Zref\text{-}1(t) - 0.625 * Zref\text{-}2(t)$$

$$ZM\text{-}6(t) := ZM\text{-}6(t) - 0.250 * Zref\text{-}1(t) - 0.750 * Zref\text{-}2(t)$$

$$ZM\text{-}7(t) := ZM\text{-}7(t) - 0.125 * Zref\text{-}1(t) - 0.875 * Zref\text{-}2(t)$$

In an embodiment, a correlation algorithm is used by processor 33. Processor 33 calculates a correlation coefficients between data sets. The dataset is a time sequence of height measurements associated with measurement spots 30. The calculated correlation coefficients between measurement signals tell something about the kind of noise influencing the level sensor LS. E.g., purely correlated noise causes a standard deviation in a measured height and may cause tilt when the noise for different spots has a phase difference (delay). On the other hand, purely uncorrelated noise causes a standard deviation in measured tilt. Combinations of correlated and un-correlated noise cause deviation in both measured height and measured tilt. In practice, noise of level sensor LS turns out to be highly correlated (correlation coefficient about 0.9), which implies that a small increase of uncorrelated (e.g. C&T=contamination and temperature control) noise causes a relatively large increase of tilt noise. Most useful about a correlation analysis is the change of it with a change in the system.

Correlation coefficients may also be calculated by processor 33 as a function of shift in time of the measurement signals and reference signals with respect to each other. This gives information about spatially moving effects on noise of the level sensor LS (air flows for instance).

Processor 33 may produce Fourier signals in the frequency domain of received measurement and reference signals. Then, processor 33 can perform a Fourier analysis. In a Fourier analysis of measurement signals, the processor may use amplitude information and phase information. The phase information gives similar information as described above for shifted correlation. The following insight may be used. A correlation coefficient corrcoef (P1, P2) between two signals P1, P2 is defined as:

corrcoef(P1,P2)=cov(P1,P2)/sqrt(cov(P1,P1)×cov(P2,P2))

where cov(P1, P2) is a covariance defined by:

cov(P1,P2)=E((P1−avP1)×(P2−avP2))

where E( . . . ) is an expectation value and av . . . an average value.

Applying these equations on Fourier transformed time signals turns out to be simple. The time averaged value av . . . is zero. P1 and P2 are single sines with an amplitude and a phase.

$$cov(P1, P2) = E(A1 \times \sin(\omega t + phi1), A2 \times \sin(\omega t + phi2))$$
$$= 1/2 \times A1 \times A2 \times E(\cos(phi1 - phi2) - \cos(2\omega t + phi1 + phi2))$$
$$= 1/2 \times A1 \times A2 \times \cos(dphi)$$

where: A1, A2=amplitudes of P1, P2
phi1, phi2=phases of P1, P2
dphi=phi1−phi2
Since cov(Pi, Pi)=½×Ai2, these equations yield:
corrcoef(f)=cos(dph(f))

Processor 33 may use a so-called "cohere" function. The "cohere" function from MatLab, (see, e.g., MATLAB: Copyright 1984-2001 The MathWorks, Inc., Version 6.3) estimates a magnitude squared coherence function using Welch's averaged periodogram method, see Rabiner, L. R., Gold, B., *Theory and Application of Digital Signal Processing*. Englewood Cliffs, N.J.: Prentice-Hall, 1975, and Welch, P. D. "*The Use of Fast Fourier Transform for the Estimation of Power Spectra. Method Based on Time Averaging Over Short, Modified Periodograms.*" IEEE Trans. Audio Electroacoust. Vol. AU-15 (June 1967). Pgs. 70-73.

For example, Cxy=cohere(x,y) finds a magnitude squared coherence estimate Cxy of two input signals x and y using Welch's averaged, modified periodogram method. The magnitude squared coherence estimate Cxy is a function of frequency with values between 0 and 1 that indicates how well x corresponds to y at each frequency. The coherence is a function of the power spectral densities (Pxx and Pyy) of x and y and the cross power spectral density (Pxy) of x and y.

$$C_{xy}(f) = \frac{|P_{xy}(f)|^2}{P_{xx}(f)P_{yy}(f)}$$

Signals x and y must have the same length in the frequency domain. For real x and y, coherence returns a one-sided coherence estimate and for complex x or y, it returns a two-sided estimate.

EXAMPLE 1

Now an example of application of these equations to a reference signal Zref(t) and measurement signal ZM(t) is given. These Zref(t) and ZM(t) are Fourier transformed by processor 33 rendering Z-ref($\omega$) and Z-M($\omega$), respectively. A correlation/coherence CM-ref($\omega$) between the reference signal Z-ref($\omega$) and the measurement signal Z-M($\omega$) per frequency is calculated by processor 33. Then, processor corrects the measurement signal Z-M($\omega$) rendering a corrected measurement signal ZcorrM($\omega$) while using the correlation CM-ref($\omega$) according to:

ZcorrM($\omega$):=Z-M($\omega$)−{CM-ref($\omega$)*Z-ref($\omega$)}   (1)

After this, the corrected measurement signal ZcorrM($\omega$) is inverse Fourier transformed, into a corrected measurement signal ZcorrM(t).

In this example, the assumption is made that the measurement signal from substrate W (which is only in the measurement signal) does not correlate with the reference signal from the reference beam 31. This is true in general, but when the height of substrate W is exactly the same as the disturbance, it will be masked by the correction.

EXAMPLE 2

In another example, processor 33 Fourier transforms two reference signals Zref-1(*t*), Zref-2(*t*) of reference spots into Z-ref-1($\omega$), Z-ref-2($\omega$), and Fourier transforms several measurement signals ZM-x(t) of measurement spots into Z-M-x($\omega$). The processor 33 calculates correlation/coherence Cr1-r2($\omega$) between these Fourier transformed reference signals Z-ref-1($\omega$), Z-ref-2($\omega$) per frequency. What correlates between these two Fourier transformed reference signals, will also correlate between measurement signals so it can be used by processor 33 for correction. Then, the processor 33 corrects Fourier transformed measurement signal Z-M-x($\omega$) to render corrected Fourier transformed measurement signals ZcorrM-x($\omega$), while using correlation Cr1-r2($\omega$) according to:

ZcorrM-1($\omega$):=Z-M-1($\omega$)−Cr1-r2($\omega$)*{0.875*Z-ref-1($\omega$)+0.125*Z-ref-2($\omega$)}

ZcorrM-2($\omega$):=Z-M-2($\omega$)−Cr1-r2($\omega$)*{0.75*Z-ref-1($\omega$)+0.25*Z-ref-2($\omega$)}

ZcorrM-3($\omega$):=Z-M-3($\omega$)−Cr1-r2($\omega$)*{0.625*Z-ref-1($\omega$)+0.375*Z-ref-2($\omega$)}

ZcorrM-4($\omega$):=Z-M-4($\omega$)−Cr1-r2($\omega$)*{0.5*Z-ref-1($\omega$)+0.5*Z-ref-2($\omega$)}   (2)

ZcorrM-5($\omega$):=Z-M-5($\omega$)−Cr1-r2($\omega$)*{0.375*Z-ref-1($\omega$)+0.625*Z-ref-2($\omega$)}

ZcorrM-6($\omega$):=Z-M-6($\omega$)−Cr1-r2($\omega$)*{0.25*Z-ref-1($\omega$)+0.75*Z-ref-2($\omega$)}

$$ZcorrM\text{-}7(\omega):=Z\text{-}M\text{-}7(\omega)-Cr1\text{-}r2(\omega)*\{0.125*Z\text{-}ref\text{-}1(\omega)+0.875*Z\text{-}ref\text{-}2(\omega)\}$$

In these equations, it is assumed that 7 measurement beams are used. After this, each corrected Fourier transformed measurement signal ZcorrM-x($\omega$) is inverse Fourier transformed, into a corrected measurement signal ZcorrM-x(t).

In example 2 the assumption is made that the correlation of the disturbance between both reference beams is smaller or equal than the disturbance in the measurement spots. This is verified experimentally and by model analysis, but when the correlation of the disturbance between both reference beams is smaller than the disturbance in the measurement spots, not all disturbances are corrected in the measurement spot. (If correlation would be higher than disturbance in measurement spot, this would give overcorrection of disturbance).

The advantage of the embodiments which incorporate the dual stage apparatus in which a wafer map is measured offline at a separate measurement stage, is that the correction at a certain time (t), is based on data before and after that time t, i.e., at times t–$\delta$ . . . t+$\delta$. All height measurements can be used, because they can be measured in advance. In a single stage apparatus only data which is already measured (t–$\delta$ . . . t) can be used by a processor in a correction operation. This reduces accuracy, because the number of data points is reduced and prediction from data in the past only is less accurate.

By using the method as explained above, reproducibility and accuracy of height measurements by a level sensor may be increased, by reducing noise and drift. The sensitivity of the level sensor LS for movements of mechanical and optical parts of the system, drift and noise of electrical parts of the system and changes in the (optical) refractive-index of the media (e.g. air, glass) is reduced significantly.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 355, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

We claim:

1. A level sensor for determining a height of a substrate, said level sensor comprising:
    a measurement beam generator that generates at least one measurement beam and direct said at least one measurement beam to a measurement spot on said substrate in order to produce at least one reflected measurement beam;
    a reference beam generator that generates at least one reference beam;
    a detector beam that detects both said at least one reflected measurement beam and said at least one reference beam, respectively, and produces at least one measurement signal and at least one reference signal, respectively, said measurement signal being indicative for said height at said measurement spot; and
    a processor that corrects said measurement signal based on said reference signal,
    wherein said level sensor comprises an optical arrangement arranged in a predetermined area close to where said substrate is to be located, and the level sensor is arranged to propagate said at least one measurement beam and said at least one reference beam along substantially equal optical paths of propagation in said predetermined area, said optical arrangement being arranged to deviate said at least one reference beam from said substantially equal optical paths of propagation in said predetermined area such that said at least one reference beam does not hit said substrate.

2. Level sensor according to claim 1, wherein said optical arrangement comprises a prism having a parallelopipidum form.

3. Level sensor according to claim 2, wherein said prism comprises an input surface arranged to receive said at least one reference beam, a reflective surface arranged to internally reflect said reference beam and an output surface for outputting said reflected beam, said reflective surface having two sub-surfaces connected to one another under an angle.

4. Level sensor according to claim 1, wherein said optical arrangement comprises a plurality of mirrors.

5. Level sensor according to claim 4, wherein said level sensor is arranged to produce at least one original beam and said plurality of mirrors comprises a semi-transparent mirror arranged to receive said at least one original beam, to split said at least one original beam into said at least one measurement beam and said at least one reference beam.

6. Level sensor according to claim 1, wherein said level sensor is arranged to measure said height of said substrate at a plurality of measurement spots and to produce a wafer map comprising said height based on said plurality of measurement spots.

7. Level sensor according to claim 1, wherein said level sensor is arranged to correct for noise and drift in said measurement signal by comparing noise and drift in said measurement signal with noise and drift in said reference signal.

8. Level sensor according to claim 1, wherein said measurement beam generator is arranged to produce a plurality of measurement beams, to produce a plurality of measurement spots by these measurement beams, wherein the detector detects a plurality of measurement signals associated with these plurality of measurement spots, wherein the reference beam generator generates a plurality of reference beams and a plurality of reference signals based on these reference beams, and wherein the processor determines a disturbance of at least one of these measurement beams by using interpolation of reference signals.

9. Level sensor according to claim 1, wherein said measurement beam generator arranged to produce a plurality of measurement beams, to produce a plurality of measurement spots by these measurement beams, wherein the detector detects a plurality of measurement signals associated with these plurality of measurement spots, wherein the reference beam generator generates a plurality of reference beams and a plurality of reference signals based on these reference beams, and wherein the processor measure a correlation between time traces of at least two of said plurality of measurement signals and reference signals, calculates a correlation coefficient relating to this correlation, and uses said correlation coefficient as a weighting factor to determine an amount to correct the measurement signals.

10. Level sensor according to claim 1, wherein said measurement beam generator is arranged to produce a plurality of measurement beams, to produce a plurality of measurement spots by these measurement beams, wherein the detector detects a plurality of measurement signals associated with these plurality of measurement spots, wherein the reference beam generator generates a plurality of reference beams and a plurality of reference signals based on these reference beams, and wherein the processor measures a correlation for a part of a frequency spectrum between at least two of said plurality of measurement signals and reference signals, and corrects said measurement signals in the part of the frequency spectrum.

11. Level sensor according to claim 1, wherein said measurement beam generator is arranged to produce a plurality of measurement beams, to produce a plurality of measurement spots by these measurement beams, wherein the detector detects a plurality of measurement signals associated with these plurality of measurement spots, wherein the reference beam generator generates a plurality of reference beams and a plurality of reference signals based on these reference beams, and wherein the processor measures a delay between time traces of at least two of said plurality of measurement signals and reference signals, and uses this delay in a delay correction method to correct said plurality of measurement signals.

12. Level sensor according to claim 1, wherein said measurement beam generator is arranged to produce a plurality of measurement beams, to produce a plurality of measurement spots by these measurement beams, wherein the detector detects a plurality of measurement signals associated with these plurality of measurement spots, wherein the reference beam generator generates a plurality of reference beams and a plurality of reference signals based on these reference beams, and wherein the processor measures a phase shift for a part of a frequency spectrum between at least two of said measurement signals and reference signals, and corrects said measurement signals in the part of the frequency spectrum.

13. Imaging apparatus comprising a level sensor according to claim 1, and arranged to produce an image to be imaged on said substrate.

14. A lithographic projection apparatus comprising an imaging apparatus according to claim 13.

15. A lithographic projection apparatus comprising an exposure stage and a measurement stage and an imaging apparatus according to claim 13.

16. A method of determining a height of a substrate comprising:
generating at least one measurement beam and directing said at least one measurement beam to a measurement spot on said substrate in order to produce at least one reflected measurement beam;
generating at least one reference beam;
detecting both said at least one reflected measurement beam and said at least one reference beam, respectively, and producing at least one measurement signal and at least one reference signal, respectively, said measurement signal being indicative for said height at said measurement spot;
correcting said measurement signal based on said reference signal; and
arranging an optical arrangement in a predetermined area close to where said substrate is to be located, and propagating said at least one measurement beam and said at least one reference beam along substantially equal optical paths of propagation in said predetermined area, deviating said at least one reference beam from said substantially equal optical paths of propagation in said predetermined area by said optical arrangement such that said at least one reference beam does not hit said substrate.

17. A level sensor for determining a height of a substrate, said level sensor comprising:
at least one source of radiation to generate at least one reference beam and to generate at least one measurement beam and direct said at least one measurement beam to a measurement spot on said substrate in order to produce at least one reflected measurement beam;
at least one detector to detect both said at least one reflected measurement beam and said at least one reference beam, respectively, and produce at least one measurement signal and at least one reference signal, respectively, said measurement signal being indicative for said height at said measurement spot; and
a processor to receive said at least one measurement signal and said at least one reference signal, and to correct said measurement signal based on said reference signal;
wherein said level sensor comprises an optical arrangement arranged in a predetermined area close to where said substrate is to be located, and the level sensor is arranged to propagate said at least one measurement beam and said at least one reference beam along substantially equal optical paths of propagation apart from in said predetermined area, said optical arrangement being arranged to deviate said at least one reference beam from said substantially equal optical paths of propagation in said predetermined area such that said at least one reference beam does not hit said substrate.

* * * * *